United States Patent

Ollero Velasco et al.

[11] Patent Number: 6,096,967
[45] Date of Patent: Aug. 1, 2000

[54] ENERGY CONVERSION SYSTEM WITH HEAT RECOVERY

[75] Inventors: Salvador Ollero Velasco; Enrique De La Cruz Moreno; Miguel Rascón Martínez, all of Madrid, Spain

[73] Assignee: Alcatel, Paris, France

[21] Appl. No.: 09/102,003

[22] Filed: Jun. 22, 1998

[30] Foreign Application Priority Data

Jun. 27, 1997 [ES] Spain ..................................... 9701426

[51] Int. Cl.⁷ ..................................... H01L 35/30

[52] U.S. Cl. ........................... 136/205; 136/242

[58] Field of Search ................... 136/201, 205, 136/203, 242

[56] References Cited

U.S. PATENT DOCUMENTS 5,419,780  5/1995  Suski ....................................... 136/205

Primary Examiner—Kathryn Gorgos
Assistant Examiner—Thomas H Parsons
Attorney, Agent, or Firm—Sughrue, Mion, Zinn, Macpeak & Seas, PLLC

[57] ABSTRACT

Electric energy conversion system (4) with heat recovery which converts a first voltage applied to input terminals (11, 12) from an energy supply network, to a second direct voltage which is applied to at least one electronic circuit (2), moreover comprising thermoelectric means (3), which transform the generated heat into electric energy during the normal operation of a first electronic device of the conversion system (4) and the electronic circuit (2), the thermoelectric means (3) generating at their output a third direct voltage, which is applied to the electronic circuit (2).

5 Claims, 2 Drawing Sheets

ENERGY CONVERSION SYSTEM WITH HEAT RECOVERY

OBJECT OF THE INVENTION

The present invention refers to an energy conversion system which supplies electric energy to electronic circuits making up a telecommunications system. Moreover, said energy conversion system recovers the generated heat, both by said conversion system and said circuits during their normal operation, transforming said heat into electric energy, which is supplied again to said circuits, increasing the overall energy efficiency.

STATE OF THE ART

A telecommunication system comprises different printed circuit boards on which different electronic circuits are assembled. Said circuits require electric energy for their operation, being supplied by at least one energy conversion system, for example, a power converter which supplies direct electric energy with the characteristics required by said circuits.

During the normal operation of the energy conversion system and the electronic circuits, one part of the electric energy is consumed and the other part is lost, said loss being dissipated as heat by means of dissipators which are normally bulky and expensive.

The heat generated during the normal operation of said telecommunication system must be evacuated from the same, otherwise a sufficiently high temperature could be reached to prevent the normal operation of said circuits.

During the design process of said systems, the printed circuit boards are distributed, in such a way that extraction of the heat generated during the operation thereof is facilitated, said design being sometimes complex. However, this thermal energy is lost anyway.

Moreover, the use of cooling systems becomes obligatory, for example, forced ventilation systems which inject an air jet which circulates between said boards and longitudinally runs through the dissipator fins, and in this way facilitates the extraction of said thermal energy.

In recent years, the functionality of electronic circuits has increased, and consequently the consumption of electric energy which has resulted in an increase in the heat generated during operation. Accordingly, part of the supplied electric energy which is lost as heat has increased.

CHARACTERIZATION OF THE INVENTION

The main objective of the present invention is to provide an energy conversion system with heat recovery, which supplies electric energy to at least one electronic circuit, so that the consumption of electric energy demanded from said circuit to an energy supply network is reduced, hence increasing the overall energy efficiency.

The electric energy conversion system converts a first voltage supplied by an energy supply network to a second direct voltage supplied to at least one electronic circuit, which constitutes the electric charge.

Thermoelectric means transform the heat generated during normal operation of at least one electronic circuit of the said conversion system and its electric charge into electric energy.

Hence, the thermoelectric means generate a second direct voltage which is supplied to said electronic circuit. Consequently, the amount of electric energy demanded by said circuit from the energy conversion system and therefore, from the energy supply network is reduced, thus increasing the global energy efficiency.

Another object is to reduce the dimensions of the passive cooling means, dissipators for example, which are assembled on those electronic circuits which reach the highest temperature. Therefore, the overall dimensions and weight of the energy conversion system and electronic circuit are reduced.

Another object is to reduce the consumption of the active cooling systems, air conditioning for example, since there is less heat to be dissipated. Generally, the telecommunication system reduces its thermal stress and its consumption of electric energy.

BRIEF DESCRIPTION OF THE DRAWINGS

The invention will be described in more detail with reference to the accompanying drawings, in which.

DESCRIPTION OF THE INVENTION

Figure 1:
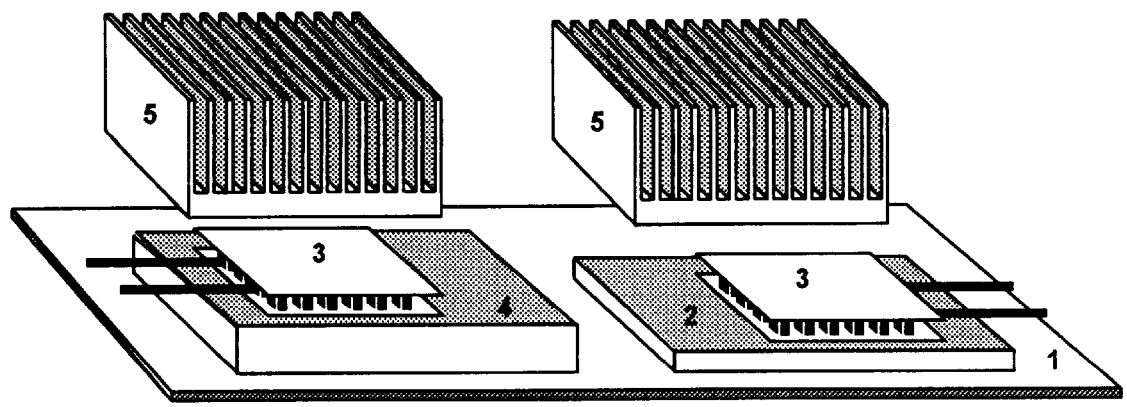
FIG. 1 shows a perspective view of a printed circuit board according to the invention.

As shown in FIG. 1, an electric energy conversion system 4 with heat recovery is connected to an energy supply network, converting a first voltage applied to input terminals 11, 12 (shown in FIG. 2) into a second direct voltage. Said conversion system 4 comprises at least one first electronic device.

The second direct voltage is applied to at least one electronic circuit 2, for example, an integrated circuit constituting the electric charge.

To better describe a preferred embodiment, it will be considered hereinafter that the electric energy conversion system 4 and the integrated circuit 2 are assembled on the same printed circuit board 1 and that they are also very close to each other; without restricting the use of the invention to this preferred embodiment.

Figure 2:
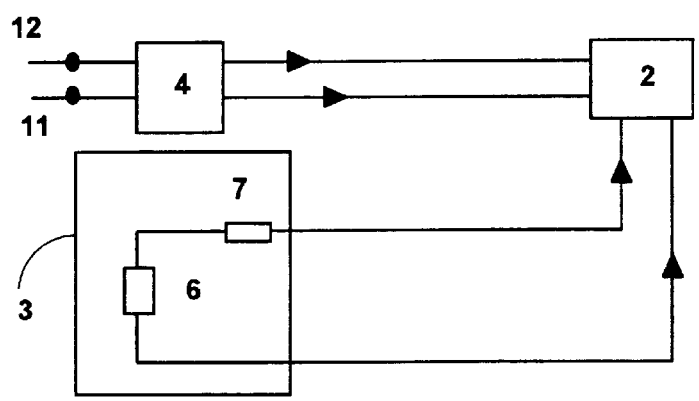
FIG. 2 shows an electric diagram of an embodiment in accordance with the invention.

With reference to FIG. 2, the energy conversion system 4 comprises thermoelectric means 3 which convert the heat generated, during normal operation of the energy conversion system 4 and the integrated circuit 2, into a third direct voltage, being applied to said circuit 2.

Figure 4:
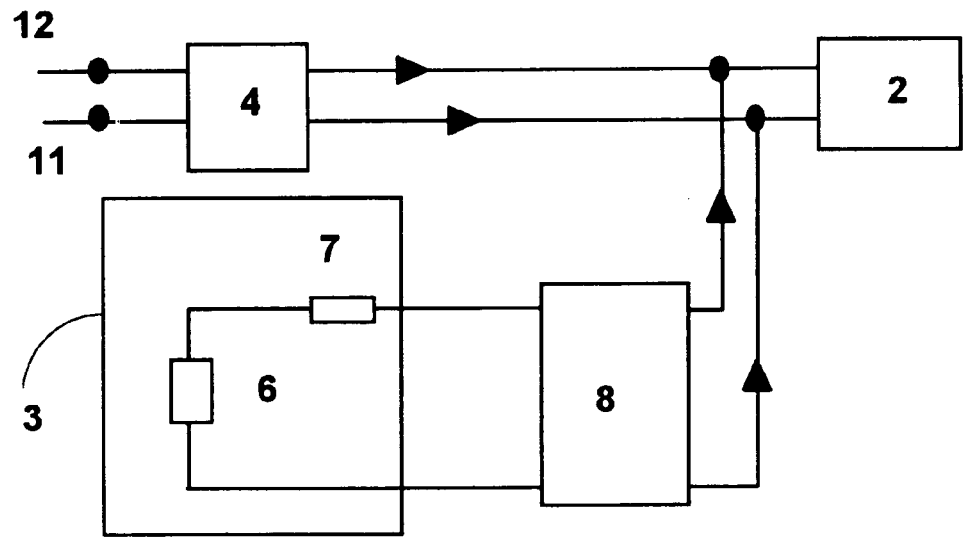
FIG. 4 shows an electric diagram of the present invention showing the electric connection between the thermoelectric means and direct-direct energy conversion means according to the invention.

The third direct voltage, for example, may have different characteristics to the second direct voltage. To adapt the characteristics of the third voltage to the characteristics of the second direct voltage, the thermoelectric means 3 are connected to direct-direct energy conversion means 8, as shown in FIG. 4.

The energy conversion means 8 adapt the third voltage to a fourth direct voltage, the characteristics of which are the same as the second direct voltage, being connected to the conversion system 4. Said conversion means 8 comprise at least one second electronic device.

Also, the direct-direct energy conversion means 8 comprise control devices which regulate their operation, in such a way that the third direct voltage is a determined value and hence, the performance and power supplied by the assembly formed by the thermoelectric means and the energy conversion means 8 are optimum.

The heat flow will be different depending on the type of integrated circuit 2 and on their operation modes, so that the control means may make the energy conversion means 8 operate in different working modes, for example, by supplying maximum power for each operation mode of the integrated circuit 2, while not obtaining a maximum performance.

As shown in FIG. 1, the thermoelectric means 3 are positioned in such a way that they collect the heat generated during the normal operation of the conversion system 4 and also, of that circuit or those electronic circuits 2 which reach the highest temperature during their operation.

Figure 3:
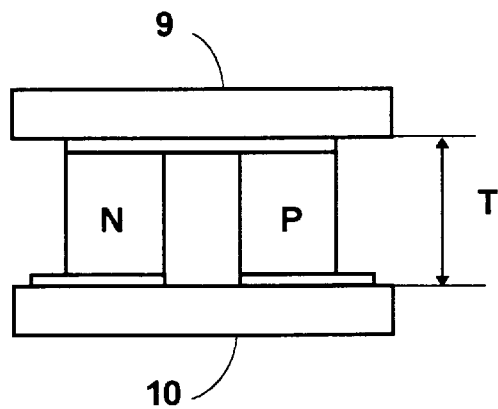
FIG. 3 shows a representation of thermoelectric means according to the invention.

Referring to FIG. 3, the thermoelectric means 3 comprise a first surface 10 (hot) and a second surface 9 (cold), between which doped thermoelectric elements N, P are fitted, for example, of the N type and the P type. The thermoelectric elements are electrically connected in series and thermally in parallel, for example.

The first surface 10 is in thermal contact with the energy conversion system 4 and/or with the integrated circuit 2 and the second surface 9 is in thermal contact with a radiator 5, for example. In the preferred embodiment, the thermoelectric means 3 are divided in two parts, one being in contact with the electric energy conversion system 4 and the other part in contact with the integrated circuit 2, for example.

The heat generated during normal operation of the conversion system 4 and the integrated circuit 2 arrives by conduction to the dissipator 5, passing into the atmosphere by convection and radiation. To favor heat exchange between the radiators 5 and the atmosphere, a cooling system (not shown) generates an air flow which passes through said radiators 5.

The thermoelectric means 3 generate the third direct voltage when there is a thermal difference T between the first surface 10 and the second surface 9. As shown in FIG. 2, the thermoelectric means 3 have an equivalent electric circuit comprising a power supply 6 and a resistance 7.

The power generated by said thermoelectric means varies according to the thermal difference T between the first 10 and second surface 9; said difference T varies according to the working conditions of the conversion system 4 and the integrated circuit 2. That is, the greater the consumption of said integrated circuit 2, the greater the consumption of the energy conversion system 4, and consequently, the greater the heat generated, hence the electric energy obtained by the thermoelectric means 3, will be greater.

However, for the same working conditions and heat flow, the power obtained and performance of the thermoelectric means 3 may vary.

To obtain maximum performance of the thermoelectric means 3, their design has to be taken care of. Hence, optimization affects the materials used, the dimensions of the first surface 10 and the second surface 9, or the separation between them. For example, a better performance has been obtained by increasing the separation between the first surface 10 and the second surface 9.

Figure 5:
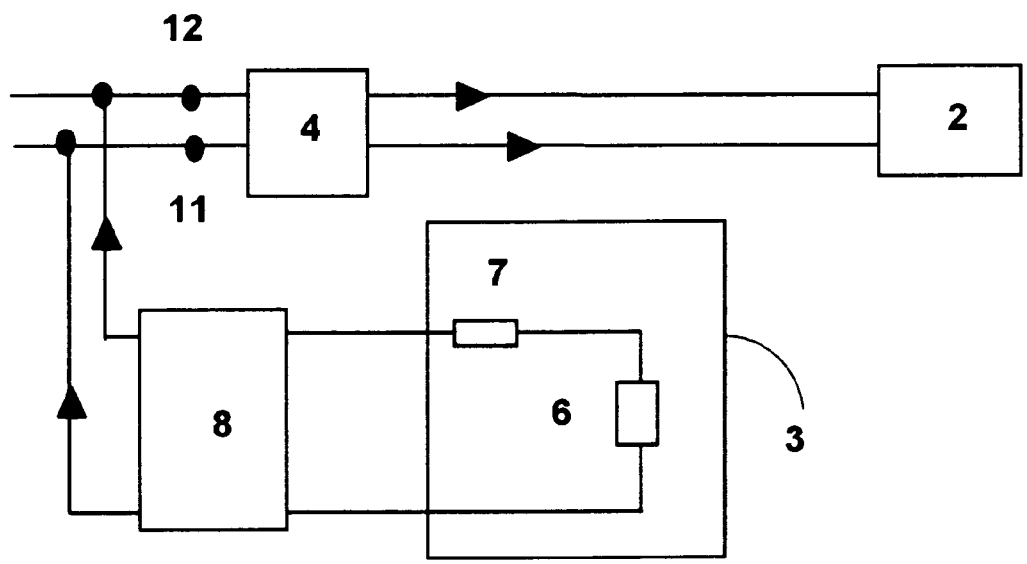
FIG. 5 shows an electric diagram of another embodiment according to the invention.

FIG. 5 shows another embodiment of the conversion system 4 and the conversion means 8, where the fourth direct voltage is applied to the input terminals 11, 12 of the conversion system 4.

In any of the described embodiments, a better optimization of the energy conversion system 4 with heat recovery may be obtained by totally or partially integrating the conversion means 8 in the conversion system 4, that is, both have common electronic devices, for example, the first electronic device. Also, a reduction in the overall cost of the energy conversion system 4 with heat recovery is obtained.

We claim:

1. An energy conversion system (4) with heat recovery which converts a first voltage applied to its input terminals (11,12) into a second direct voltage, being applied to at least one electronic circuit (2), characterized in that said system also comprises a thermoelectric generator (3) which converts the thermal energy generated during the operation of at least a first electronic device comprised in said energy conversion 003 system (4) into a third direct voltage, which is applied to said electronic circuit (2), wherein said thermoelectric generator (3) comprise a direct-direct energy converter (8), which adapt the third direct voltage to a fourth direct voltage which is applied to the electronic circuit.

2. An energy conversion system (4) according to claim 1, characterized in the direct-direct energy converter (8) shares at least the first electronic device of said energy conversion system.

3. An energy conversion system (4) with heat recovery which converts a first voltage applied to its input terminals (11,12) into a second direct voltage which is applied to at least one electronic circuit (2), characterized in that the system also comprises a thermoelectric generator (3) which converts the thermal energy generated during the operation of at least a first electronic device comprised in said energy conversion system (4) into a third direct voltage which is applied to said electronic circuit (2), said thermoelectric generator (3) comprising a direct-direct energy converter (8) which adapts the third direct voltage to a fourth direct voltage, said fourth direct voltage being applied to the electronic circuit and to the input terminals (11,12) of said energy conversion system.

4. An energy conversion system (4) with heat recovery which converts a first voltage applied to its input terminals (11,12) into a second direct voltage which is applied to at least one electronic circuit (2), characterized in that the system also comprises a thermoelectric generator (3) which converts the thermal energy generated during the operation of at least a first electronic device comprised in said energy conversion system (4) into a third direct voltage which is applied to said electronic circuit (2), said thermoelectric generator (3) comprising a direct-direct energy converter (8) which adapts the third direct voltage to a fourth direct voltage which is applied to the electronic circuit, said direct-direct energy converter comprising a controller regulating the operation of said energy converter (8) in such a way that the third direct voltage is a determined value.

5. An energy conversion system (4) according to claim 4, characterized in that the power released by the direct-direct energy converter (8) adopts a value determined by the controller, for each operation mode of the electronic circuit (2).

* * * * *

UNITED STATES PATENT AND TRADEMARK OFFICE
CERTIFICATE OF CORRECTION

PATENT NO. : 6,096,967
DATED : August 1, 2000
INVENTOR(S) : Salvador Ollero Velasco, Enrique De La Cruz Moreno, Miguel Rascon Martinez It is certified that error appears in the above-identified patent and that said Letters Patent is hereby corrected as shown below:

Column 3,
Line 25, delete "radiator" and insert -- dissipator --.

Column 4, claim 1,
Line 8, delete "003".

Signed and Sealed this

Thirteenth Day of November, 2001

*Attest:*

*Attesting Officer*

NICHOLAS P. GODICI
*Acting Director of the United States Patent and Trademark Office*